(12) United States Patent (10) Patent No.: US 12,628,716 B2

Matsuzawa et al. (45) Date of Patent: May 12, 2026

(54) SEMICONDUCTOR DEVICE

(71) Applicant: FUJI ELECTRIC CO., LTD.,
Kawasaki (JP)

(72) Inventors: Kensuke Matsuzawa, Matsumoto-city
(JP); Taisuke Fukuda, Matsumoto-city
(JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 391 days.

(21) Appl. No.: 18/495,043

(22) Filed: Oct. 26, 2023

(65) Prior Publication Data

US 2024/0170376 A1 May 23, 2024

(30) Foreign Application Priority Data

Nov. 17, 2022 (JP) ................................. 2022-184467

(51) Int. Cl.
| | |
|---|---|
| *H05K 1/14* | (2006.01) |
| *H10W 40/00* | (2026.01) |
| *H10W 70/40* | (2026.01) |
| *H10W 90/00* | (2026.01) |
| *H10W 72/00* | (2026.01) |

(52) U.S. Cl.
CPC .......... *H10W 90/811* (2026.01); *H10W 40/00*
(2026.01); *H10W 70/468* (2026.01); *H10W
72/871* (2026.01); *H10W 90/754* (2026.01);
*H10W 90/763* (2026.01)

(58) Field of Classification Search
CPC ...................................................... H05K 1/142
See application file for complete search history.

(56) References Cited

U.S. PATENT DOCUMENTS

| | | | |
|---|---|---|---|
| 11,398,450 B2 | 7/2022 | Kato et al. | |
| 2021/0280556 A1* | 9/2021 | Kato ..................... | H01L 25/072 |
| 2021/0358830 A1* | 11/2021 | Sato .................... | H01L 23/3735 |
| 2021/0384111 A1 | 12/2021 | Voss et al. | |

FOREIGN PATENT DOCUMENTS

| | | |
|---|---|---|
| JP | 2019-071502 A | 5/2019 |
| JP | 2021-141220 A | 9/2021 |

* cited by examiner

*Primary Examiner* — Christopher A Johnson

(57) ABSTRACT

A semiconductor device includes: a conductive substrate; a
plurality of semiconductor chips each having a first main
electrode on a bottom surface side and a second main
electrode on a top surface side, the plural semiconductor
chips being arranged to form a first column and a second
column connected parallel to each other on the conductive
substrate; and a control wiring substrate including an insu-
lating layer, a plurality of top-surface conductive layers
provided on a top surface of the insulating layer, and a
plurality of bottom-surface conductive layers each having a
narrower width than the insulating layer and provided on a
bottom surface of the insulating layer, the bottom-surface
conductive layers being arranged on the conductive sub-
strate between the first column and the second column of the
semiconductor chips.

4 Claims, 19 Drawing Sheets

FIG. 5

F I G. 6
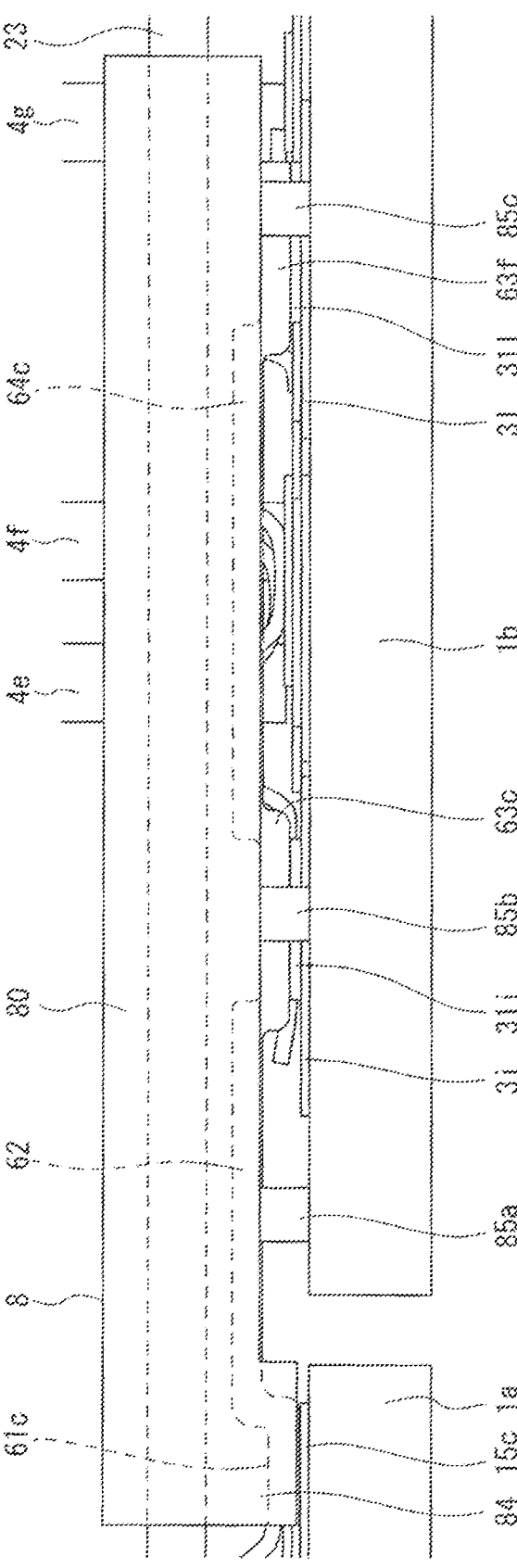

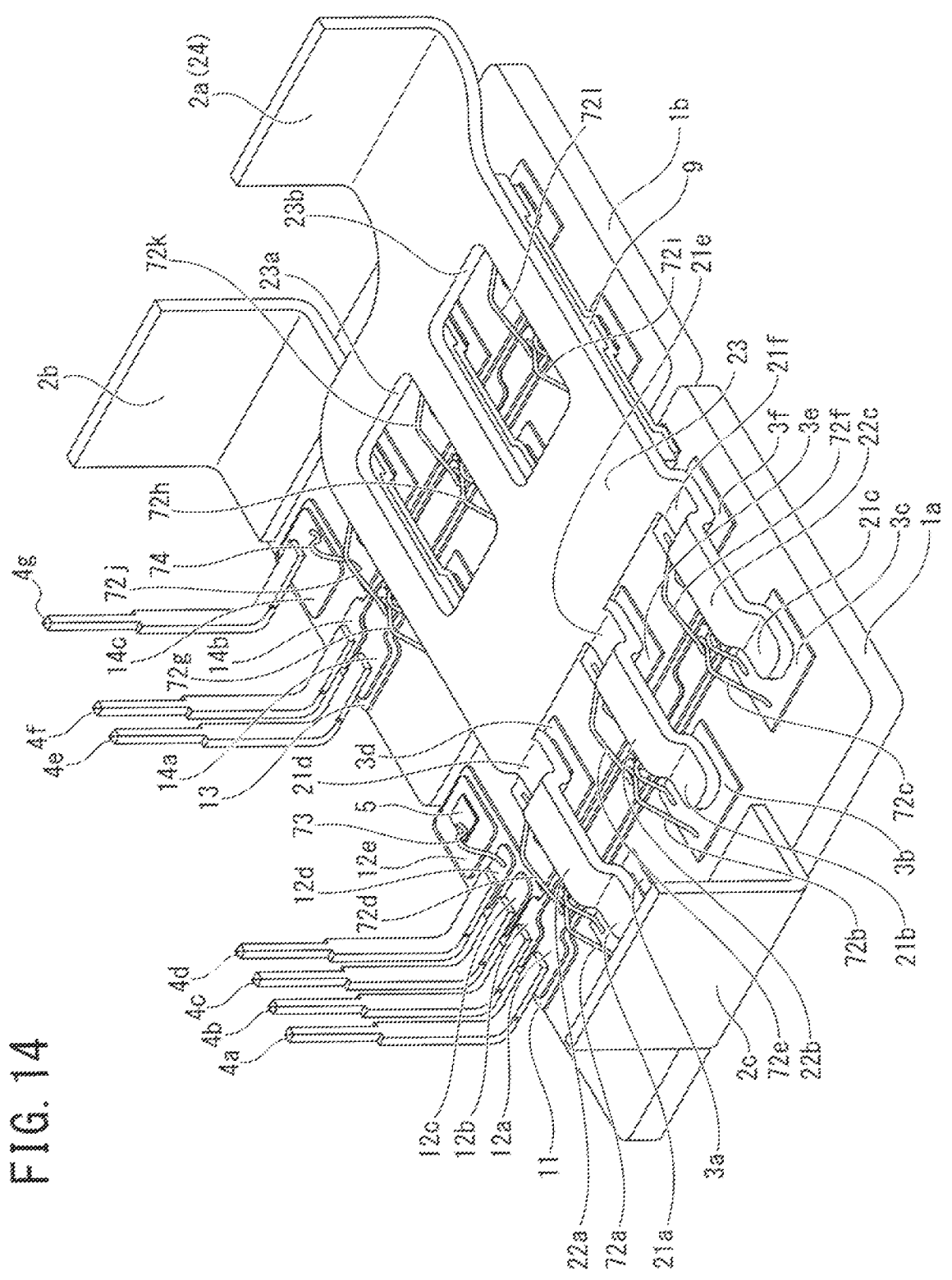
F I G. 14

FIG. 19

SEMICONDUCTOR DEVICE

CROSS-REFERENCE TO RELATED APPLICATION

This application claims benefit of priority under 35 USC 119 based on Japanese Patent Application No. 2022-184467 filed on Nov. 17, 2022, the entire contents of which are incorporated by reference herein.

BACKGROUND OF THE INVENTION

1. Field of the Invention

The present invention relates to a semiconductor device (a power semiconductor module) equipped with power semiconductor elements.

2. Description of the Related Art

US 2021/0384111 A1 discloses a semiconductor package including a distribution element provided with a first transmission path for a first electrical signal between a first lead and a first bond pad of one or more semiconductor dies and a second transmission path for the first electrical signal between the first lead and a second bond pad of the one or more semiconductor dies, wherein the distribution element includes at least one integrally-formed circuit element that creates a difference in transmission characteristics between the first and second transmission paths.

JP 2021-141220 A discloses a semiconductor device including a control wiring substrate arranged between a first column and a second column of a plurality of semiconductor elements connected in parallel to each other and including a gate wiring layer and a source wiring layer each extending parallel to the direction in which the first and second columns are arranged, a gate wiring member connecting one of gate electrodes of the semiconductor elements to the gate wiring layer, and a source wiring member connecting one of source electrodes of the semiconductor elements to the source wiring layer.

JP 2019-71502 A discloses a semiconductor device including a printed substrate arranged at circumferential edges of a housing parts housing a stacked substrate in a case, the printed substrate being provided thereon with a terminal block holding a control terminal, wherein a gate electrode of a semiconductor chip and the printed substrate are electrically connected to each other via wires.

The conventional power semiconductor modules, if the semiconductor chip is mounted on the circuit pattern of the insulated circuit substrate, and the semiconductor chip is electrically connected to a control wiring substrate provided as another member different from the insulated circuit substrate via lead frames and bonding wires, have a problem that a width of an insulating region of the control wiring substrate needs to be widely ensured in order to keep a creepage insulating distance between the wires provided in the control wiring substrate and the pattern layer on the insulated circuit substrate.

SUMMARY OF THE INVENTION

In view of the foregoing problems, the present invention provides a semiconductor device having a configuration capable of decreasing an area of a control wiring substrate to be provided.

An aspect of the present invention inheres in a semiconductor device including: a conductive substrate; a plurality of semiconductor chips each having a first main electrode on a bottom surface side and a second main electrode on a top surface side, the plural semiconductor chips being arranged to form a first column and a second column connected parallel to each other on the conductive substrate; and a control wiring substrate including an insulating layer, a plurality of top-surface conductive layers provided on a top surface of the insulating layer, and a plurality of bottom-surface conductive layers each having a narrower width than the insulating layer and provided on a bottom surface of the insulating layer, the bottom-surface conductive layers being arranged on the conductive substrate between the first column and the second column of the semiconductor chips.

The semiconductor device may further include a temperature detection chip on the control wiring substrate.

In the semiconductor device, the plural top-surface conductive layers may extend parallel to each other and have wide regions alternately arranged.

In the semiconductor device, the plural top-surface conductive layers each may have a terminal.

It should be noted that the above summary of the invention does not list all the necessary features of the invention. Subcombinations of these feature groups can also be inventions.

BRIEF DESCRIPTION OF THE DRAWINGS

FIG. 5 is a side view corresponding to FIG. 3 and FIG. 4;

FIG. 6 is an enlarged side view illustrating region A in FIG. 5;

FIG. 14 is a perspective view omitting the illustration of a part of a semiconductor device according to a second embodiment:

FIG. 19 is a side view for explaining a method of assembling the laminated structure illustrated in FIG. 17:

DETAILED DESCRIPTION

Figure 1:
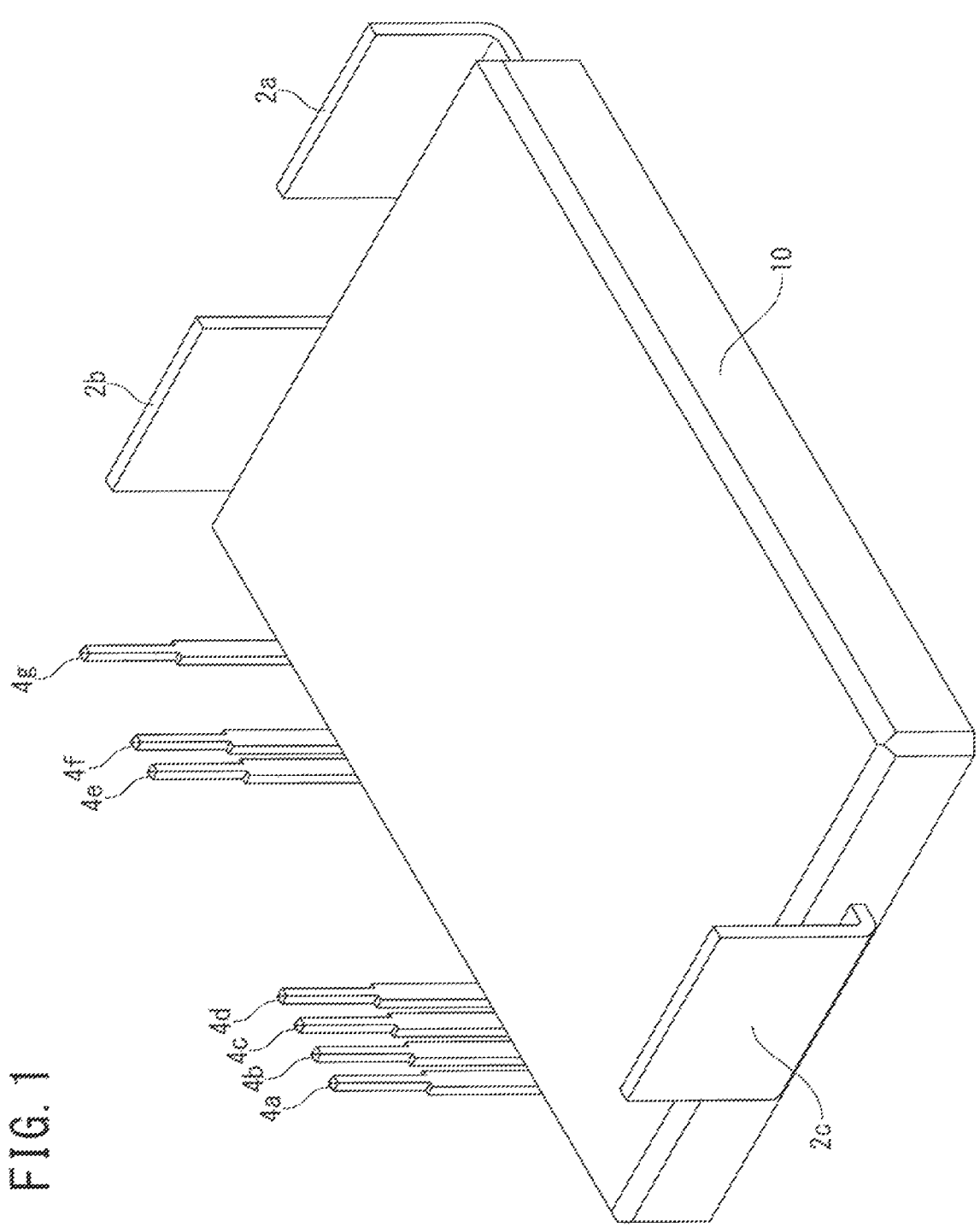
FIG. 1 is a perspective view illustrating a semiconductor device according to a first embodiment.

With reference to the drawings, first and second embodiments of the present invention will be described below.

In the drawings, the same or similar elements are indicated by the same or similar reference numerals.

The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

Additionally, definitions of directions such as "upper", "lower", "upper and lower", "left", "right", and "left and right" in the following description are simply definitions for convenience of description, and do not limit the technological concept of the present invention. For example, when observing an object rotated by 90°, the "upper and lower" are converted to "left and right" to be read, and when observing an object rotated by 180°, the "upper and lower" are read reversed, which should go without saying. In addition, an "upper surface" and a "lower surface", respectively, may be read as "front surface" and "back surface". In addition, the "first main surface" and the "second main surface" of each member are main surfaces facing each other. For example, if the "first main surface" is the upper surface, the "second main surface" is the lower surface.

First Embodiment

<Structure of Semiconductor Device>

Figure 2:
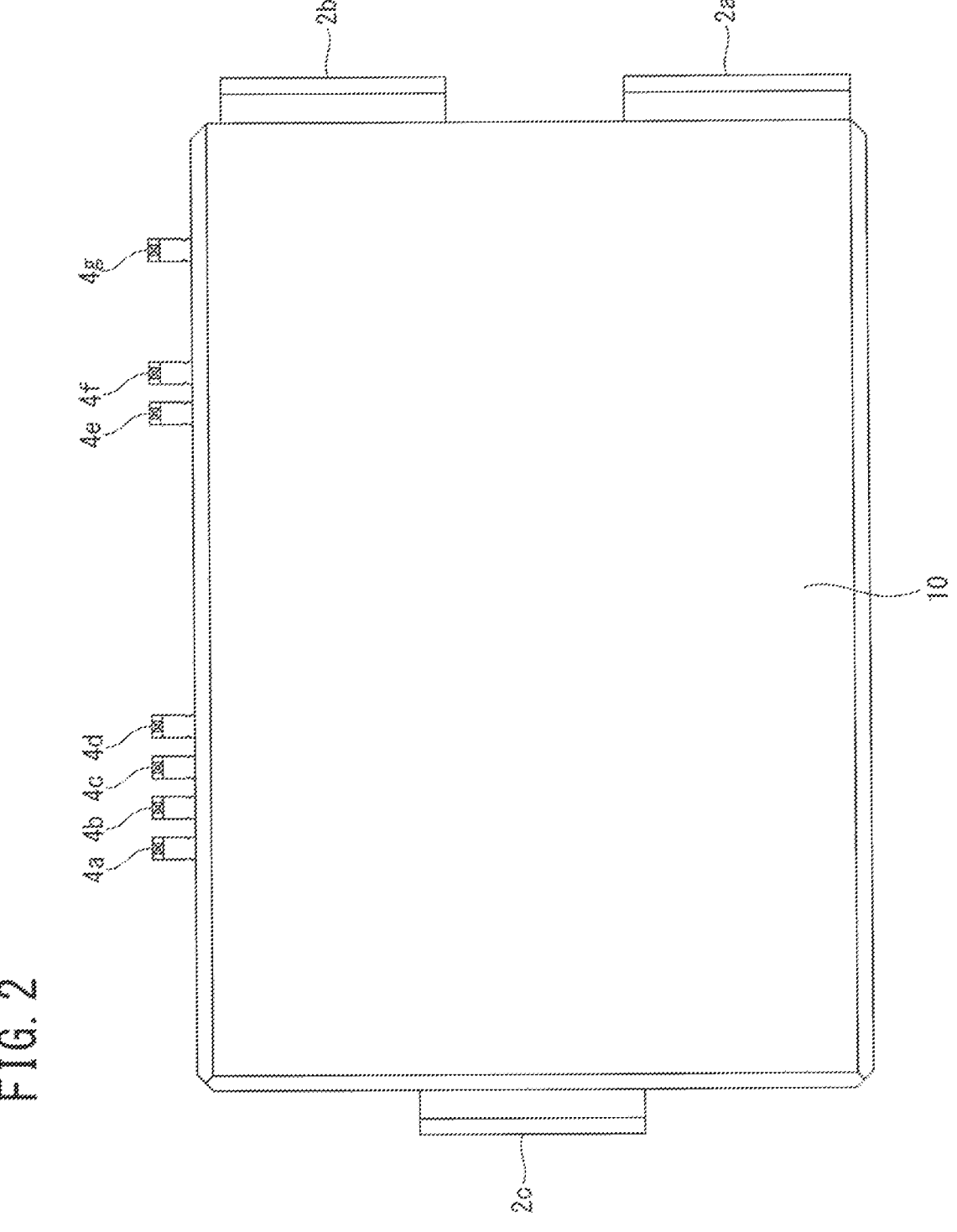
FIG. 2 is a plan view corresponding to FIG. 1.

FIG. 1 is a perspective view illustrating a semiconductor device (a power semiconductor module) according to a first embodiment, and FIG. 2 is a plan view illustrating the semiconductor device according to the first embodiment. As illustrated in FIG. 1 and FIG. 2, the semiconductor device according to the first embodiment includes a sealing resin 10 that seals power semiconductor elements (semiconductor chips), and an external terminal (a negative electrode terminal) 2a, an external terminal (a positive electrode terminal) 2b, an external terminal (an output terminal) 2c, and control terminals 4a to 4g each projecting from the sealing resin 10.

The sealing resin 10 has a substantially rectangular parallelepiped. The negative electrode terminal 2a and the positive electrode terminal 2b project from the common one surface of the substantially rectangular parallelepiped of the sealing resin 10. The output terminal 2c projects from another one surface of the substantially rectangular parallelepiped of the sealing resin 10 opposed to the surface from which the negative electrode terminal 2a and the positive electrode terminal 2b project. The control terminals 4a to 4g project from still another one surface of the substantially rectangular parallelepiped of the sealing resin 10 located between the surface from which the negative electrode terminal 2a and the positive electrode terminal 2b project and the surface from which the output terminal 2c projects.

The sealing resin 10 is made of resin having the insulating properties such as epoxy resin. The output terminal 2c, the positive electrode terminal 2b, the negative electrode terminal 2a, and the control terminals 4a to 4g are each made from conductive material such as copper (Cu), a Cu alloy, aluminum (Al), or an Al alloy, for example.

Figure 3:
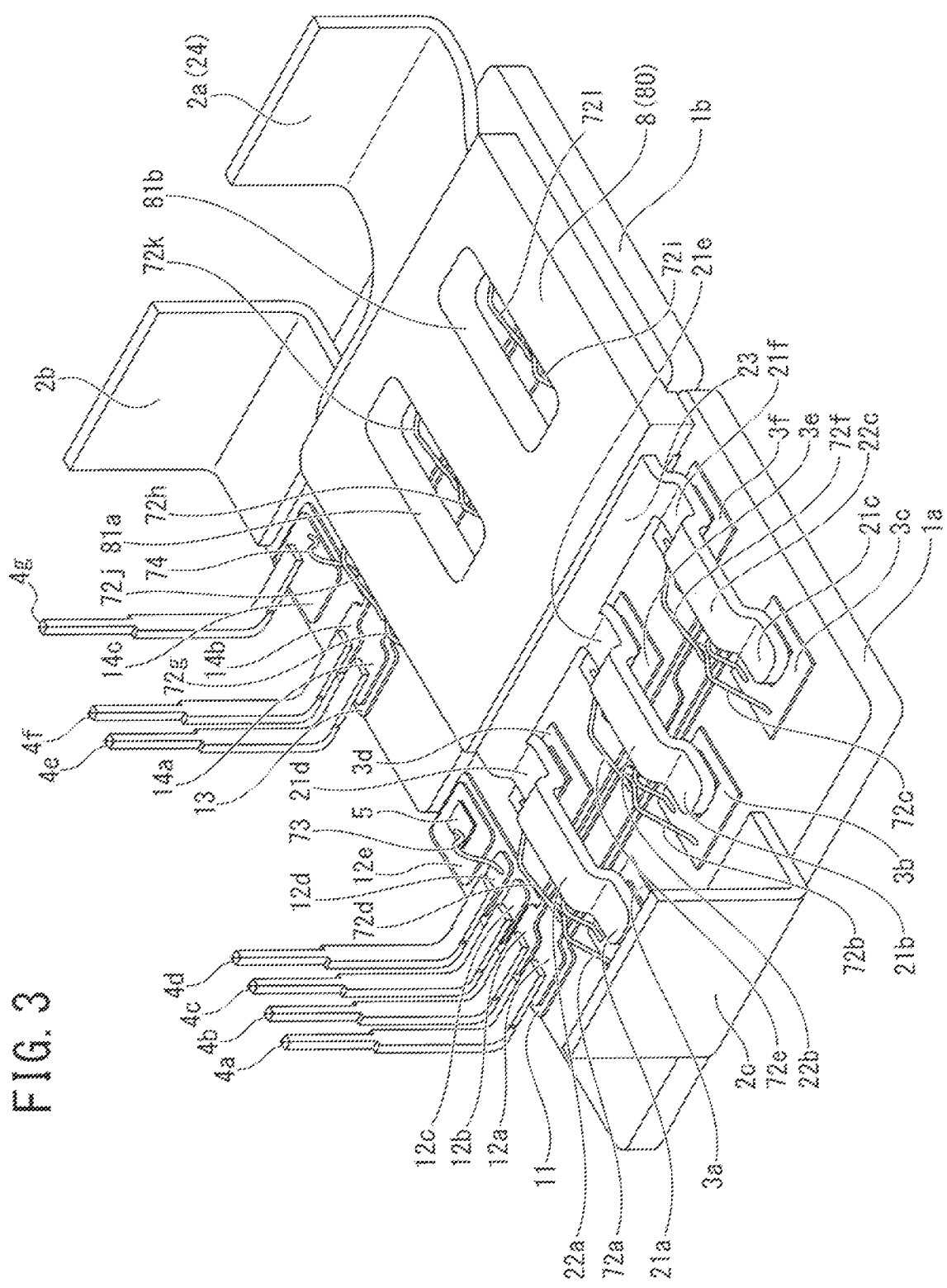
FIG. 3 is a perspective view omitting the illustration of a part of the semiconductor device according to the first embodiment.
Figure 4:
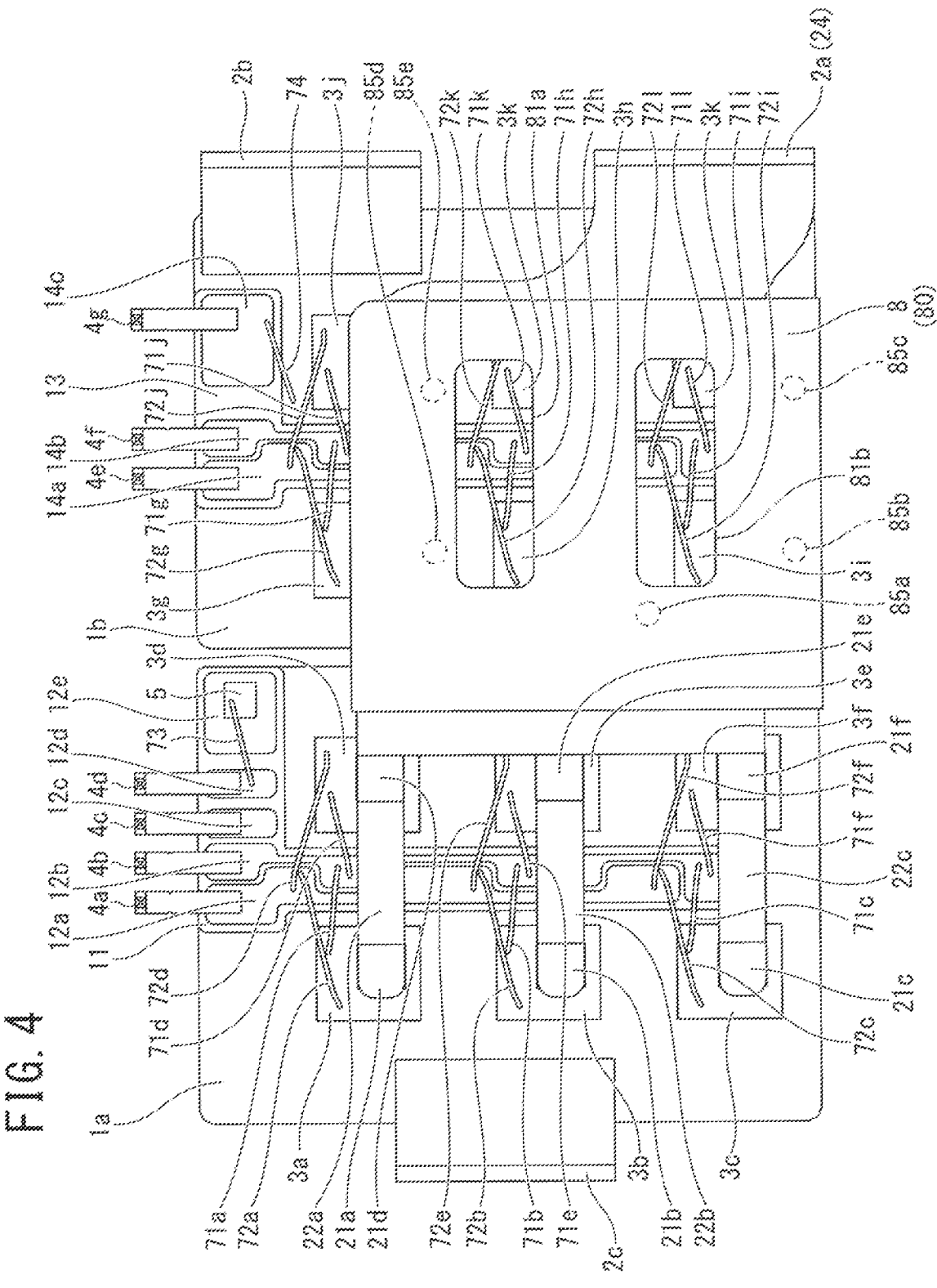
FIG. 4 is a plan view corresponding to FIG. 3.
Figure 5:
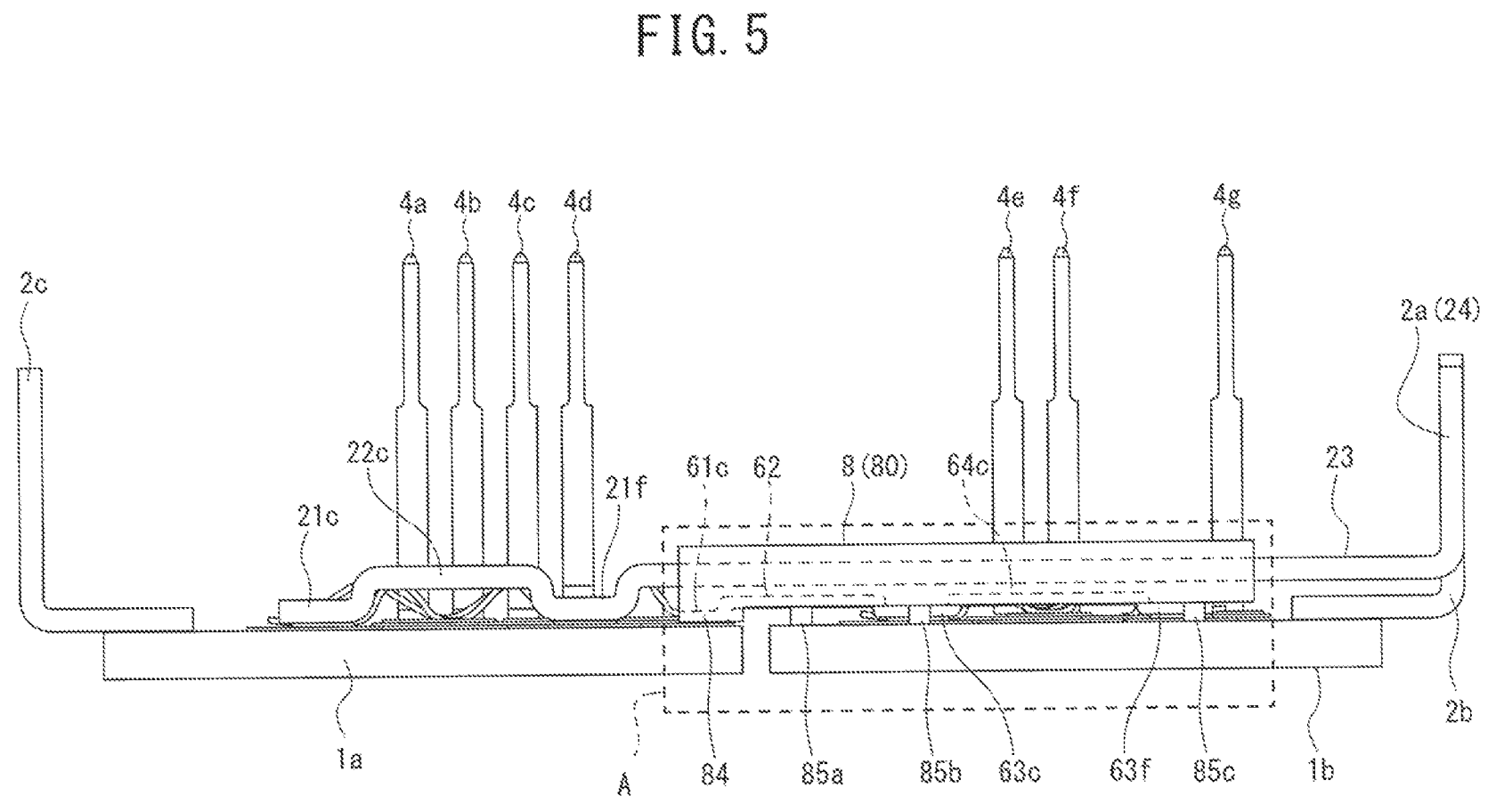

FIG. 3 is a perspective view illustrating the semiconductor device according to the first embodiment while omitting the sealing resin 10 illustrated in FIG. 1 and FIG. 2. FIG. 4 is a plan view corresponding to FIG. 3, FIG. 5 is a side view corresponding to FIG. 3, and FIG. 6 is an enlarged side view of region A in FIG. 5.

As illustrated in FIG. 3 to FIG. 6, the semiconductor device according to the first embodiment includes a conductive substrate 1a and a conductive substrate 1b arranged separately from each other. The conductive substrate 1a and the conductive substrate 1b each have a substantially rectangular planar pattern. The conductive substrate 1a and the conductive substrate 1b are each made from conductive material such as copper (Cu) and aluminum (Al), for example. The respective bottom surfaces of the conductive substrate 1a and the conductive substrate 1b are exposed on the sealing resin 10 illustrated in FIG. 1 and FIG. 2.

The output terminal 2c is a flat plate bent into an L-shape, and is bonded to the conductive substrate 1a by use of bonding material such as solder or sintered material or by direct bonding. The positive electrode terminal 2b is a flat plate bent into an L-shape, and is bonded to the conductive plate 1b by use of bonding material such as solder or sintered material or by direct bonding. The negative electrode terminal 2a is arranged next to the positive electrode terminal 2b, and includes an external connection part 24 that is a flat plate bent into an L-shape. The negative electrode terminal 2a extends toward the output terminal 2c so as to be elongated across the conductive substrate 1a and the conductive substrate 1b.

Figure 9:
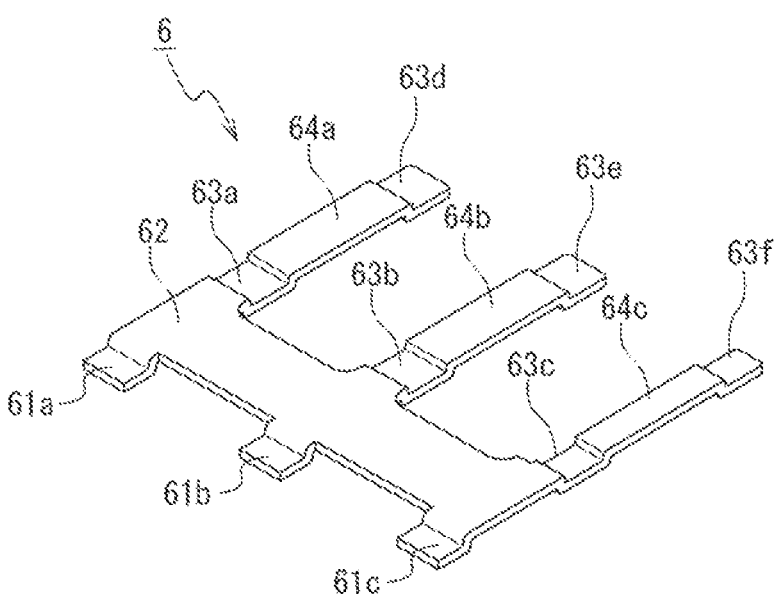
FIG. 9 is a perspective view illustrating a conductive member of the semiconductor device according to the first embodiment.

Although not illustrated in FIG. 3 or FIG. 4, a conductive member (also referred to as an "intermediate clip" or a "lead frame") 6 illustrated in FIG. 9 is interposed between the negative electrode terminal 2a and the respective conductive substrates 1a and 1b. The conductive member 6 is arranged to be separately opposed to a part of the negative electrode terminal 2a. A part of the negative electrode terminal 2a and a part of the conductive member 6 are covered with a resin member 8.

The negative electrode terminal 2a, the conductive member 6, and the resin member 8 are integrated together by integral molding so as to implement an integrated structure body (2a, 6, 8). The resin member 8 is partly interposed between the negative electrode terminal 2a and the conductive member 6. The integration molding of the negative electrode terminal 2a, the conductive member 6, and the resin member 8 while keeping a gap between the negative electrode terminal 2a and the conductive member 6 with the resin member 8 interposed can ensure a low inductance and insulation properties and allow a void management (evaluation). Further, integrating the negative electrode terminal 2a, the conductive member 6, and the resin member 8 together as a single component can avoid an increase in cost derived from a complication of jigs or lead frames, and can lead to a decrease in the manufacturing steps. The respective structures of the negative electrode terminal 2a, the conductive member 6, and the resin member 8 are described below.

Figure 7:
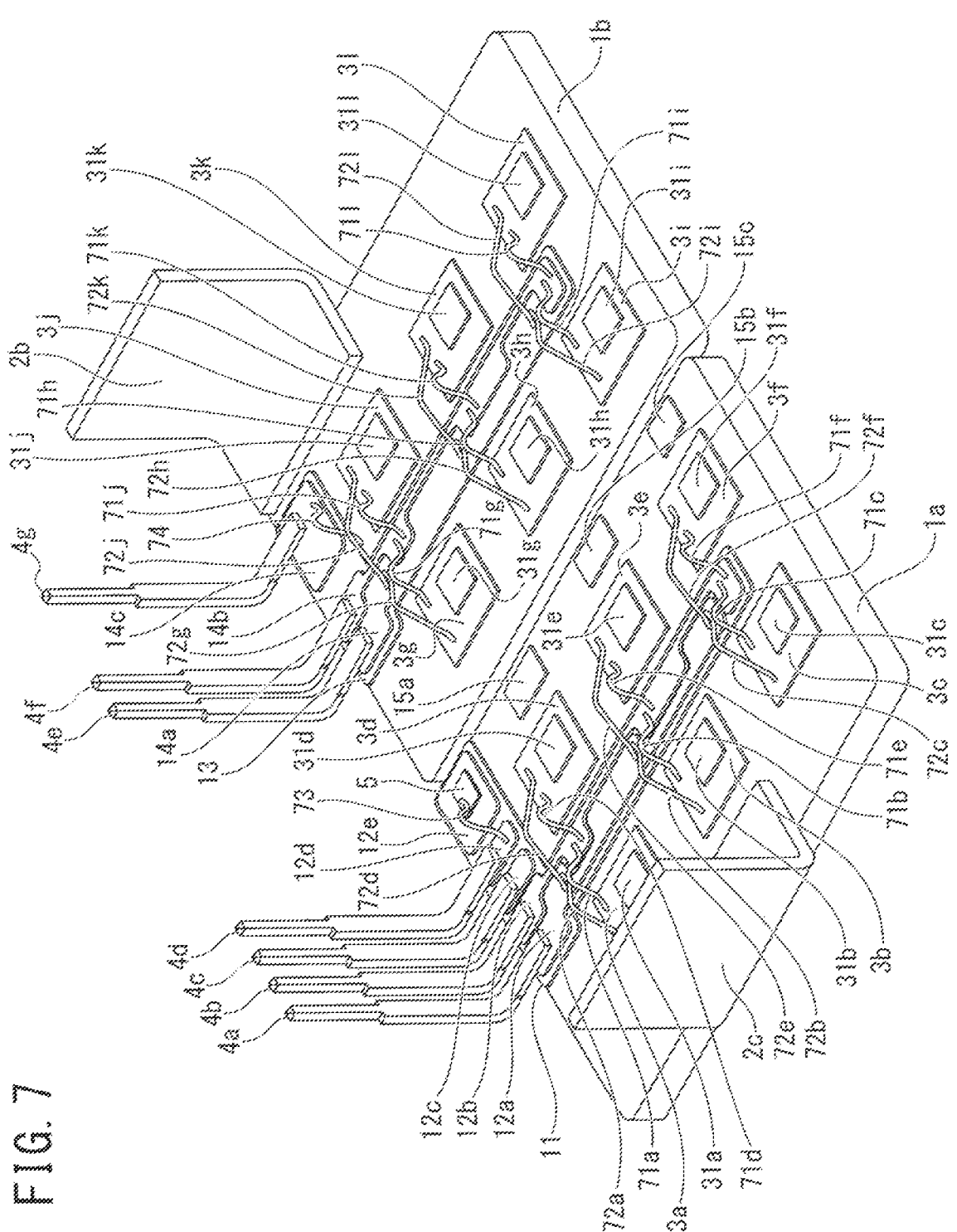
FIG. 7 is a perspective view omitting the illustration of a part of the semiconductor device according to the first embodiment.
Figure 8:
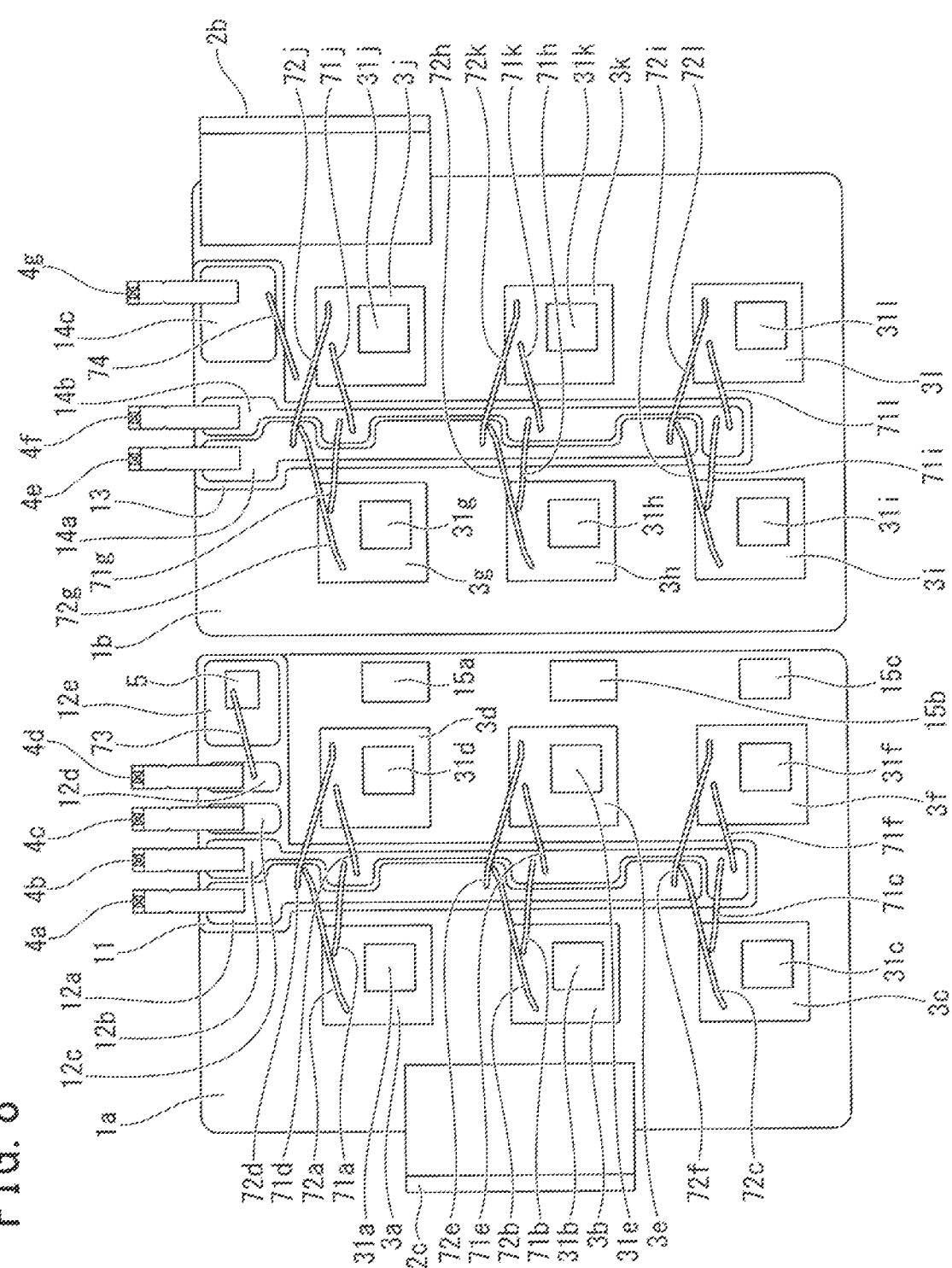
FIG. 8 is a plan view corresponding to FIG. 7.

FIG. 7 is a perspective view illustrating the semiconductor device according to the first embodiment while omitting the sealing resin 10 illustrated in FIG. 1 and FIG. 2 and further omitting the integrated structure body (2a, 6, 8) implemented by the negative electrode terminal 2a, the conductive member 6, and the resin member 8. FIG. 8 is a plan view corresponding to FIG. 7.

As illustrated in FIG. 7 and FIG. 8, the semiconductor device according to the first embodiment includes a plurality of (six) power semiconductor elements (semiconductor chips) 3a to 3f arranged on the top surface side of the conductive substrate 1a, and a plurality of (six) power semiconductor elements (semiconductor chips) 3g to 3l arranged on the top surface side of the conductive substrate 1b. The semiconductor chips 3a to 3f are bonded onto the conductive substrate 1a by use of bonding material such as solder or sintered material. The semiconductor chips 3g to 3l are bonded onto the conductive substrate 1b by use of bonding material such as solder or sintered material. The semiconductor chips 3a to 3f are arranged to form a first column and a second column connected in parallel on the conductive substrate 1a.

The semiconductor device according to the first embodiment is illustrated with a case in which the semiconductor chips 3a to 3l are each a MOSFET, and is illustrated with a "2-in-1" power semiconductor module including two sets of the six MOSFETS arranged in parallel, the two sets being connected in series. The set of the semiconductor chips 3a to 3f serves as a lower arm of a half bridge circuit for one phase in a three-phase inverter circuit, and the other set of the semiconductor chips 3g to 3l serves as an upper arm. The semiconductor device according to the first embodiment is not limited to the 2-in-1 semiconductor module, and may be a 6-in-1 semiconductor module instead.

The semiconductor chips 3a to 3l include first main electrodes (drain electrodes) provided on the bottom surface side of the semiconductor substrate, and second main electrodes (source electrodes) 31a to 31l and control electrodes (gate electrodes) provided on the top surface side of the semiconductor substrate. The respective drain electrodes of the semiconductor chips 3a to 3f are electrically connected to the conductive substrate 1a. The respective drain electrodes of the semiconductor chips 3g to 3l are electrically connected to the conductive substrate 1b.

The respective semiconductor substrates of the semiconductor chips 3a to 3l include silicon (Si), silicon carbide (SIC), gallium nitride (GaN), or gallium oxide (Ga$_2$O$_3$), for example. The arranged positions and the number of the semiconductor chips 3a to 3l may be changed as appropriate. The semiconductor chips 3a to 3l are each a field effect transistor (FET) such as a MOSFET, or may be an insulated gate bipolar transistor (IGBT), a static induction (SI) thyristor, or a gate turn-off (GTO) thyristor.

Figure 22:
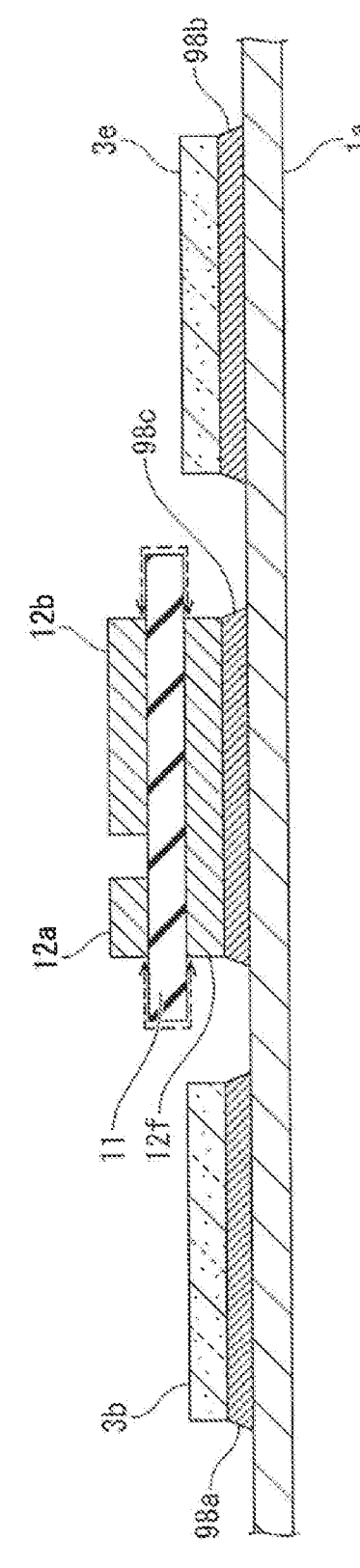
FIG. 22 is a cross-sectional view illustrating a part of the packaged structure of the semiconductor device according to the first embodiment.

A printed substrate for control wiring (11, 12a to 12f) is arranged on the top surface side of the conductive substrate 1a. This printed substrate is also referred to herein as a control wiring substrate. The printed substrate for control wiring (11, 12a to 12f) includes an insulating layer 11, conductive layers 12a to 12e arranged separately from each other on the top surface side of the insulating layer 11, and a conductive layer 12f arranged on the bottom surface side of the insulating layer 11 and having a narrower width than the insulating layer 11. The insulating layer 11 is made of a ceramic plate mainly including aluminum oxide (Al$_2$O$_3$), aluminum nitride (AlN), silicon nitride (Si$_3$N$_4$), or boron nitride (BN), or a resin insulating layer including polymer material, for example. The resin insulating layer may be a layer obtained such that glass fibers are impregnated with epoxy resin. The conductive layers 12a to 12f each include copper (Cu) or aluminum (Al), for example. FIG. 22 is a cross-sectional view regarding the printed substrate (11, 12a, 12b, 12f) arranged between the semiconductor chip 3b and the semiconductor chip 3e in the packaged structure of the semiconductor device illustrated in FIG. 7. The conductive layer 12f is bonded to the top surface side of the conductive substrate 1a via a bonding material 98c. The provision of the conductive layer 12f, which has the narrower width than the insulating layer 11, can ensure a long creepage insulation distance from the end part of the conductive layer 12f to the respective end parts of the conductive layers 12a and 12b via the bottom surface at the end parts, the side surfaces, and the top surface at the end parts of the conductive layer 11, as indicated by the broken lines. Namely, this structure in which the bottom surface at the end parts and the top surface at the end parts of the insulating layer 11 overlap with each other can decrease the distance between the semiconductor chip 3b and the semiconductor chip 3e, as compared with a case in which the insulating layer 11 is directly deposited on the top surface of the conductive substrate 1a. The cross section of the printed substrate (13, 14a, 14b, 14f not illustrated: arranged on the bottom surface of the insulating layer 11) between the respective semiconductor chips 3h and 3k is the same as that described above, and overlapping explanations are not repeated below. The conductive layer 14f has a narrower width than the insulating layer 11, as in the case of the conductive layer 12f. The bonding materials 98a to 98c as used herein each can be solder or sintered material.

The insulating layer 11 and the conductive layer 12a extend from the end part of the conductive substrate 1a along the region between the semiconductor chips 3a to 3c and the semiconductor chips 3d to 3f. The conductive layer 12a and the conductive layer 12b each have wide regions alternately arranged. The control terminal 4a is bonded to the conductive layer 12a by use of bonding material such as solder or sintered material. The respective wide regions of the conductive layer 12a are electrically connected to the respective gate electrodes of the semiconductor chips 3a to 3f via control wires (bonding wires) 72a to 72f. The control terminal 4a applies a control signal to the respective gate electrodes of the semiconductor chips 3a to 3f through the conductive layer 12a and the respective bonding wires 72a to 72f.

The conductive layer 12b is arranged parallel to the conductive layer 12a so as to extend from the end part of the conductive substrate 1a along the region between the semiconductor chips 3a to 3c and the semiconductor chips 3d to 3f. The conductive layer 12a and the conductive layer 12b each have wide regions alternately arranged. The control terminal 4b is bonded to the conductive layer 12b by use of bonding material such as solder or sintered material. The respective wide regions of the conductive layer 12b are electrically connected to part of the respective source electrodes 31a to 31f of the semiconductor chips 3a to 3f via control wires (bonding wires) 71a to 71f. The control terminal 4b detects a current flowing through the respective source electrodes 31a to 31f of the semiconductor chips 3a to 3f via the respective bonding wires 71a to 71f and the conductive layer 12b.

The control terminal 4c is bonded to the conductive layer 12c by use of bonding material such as solder or sintered material. The control terminal 4d is bonded to the conductive layer 12d by use of bonding material such as solder or sintered material. A temperature detection chip 5 is bonded to the conductive layer 12e by use of bonding material such as solder or sintered material. The conductive layer 12d is connected to the temperature detection chip 5 via a control wire (a bonding wire) 73. The control terminal 4d detects a temperature detection signal from the temperature detection chip 5 through the bonding wire 73 and the conductive layer 12d.

The conductive substrate 1a is provided with pads 15a to 15c on the top surface side at positions adjacent to the conductive substrate 1b. The respective pads 15a to 15c are bonded to the top surface of the conductive substrate 1a by use of bonding material such as solder or sintered material. The pads 15a to 15c are made from conductive material such as copper (Cu) or aluminum (Al), for example. The respective pads 15a to 15c may be formed integrally with the conductive substrate 1a.

The conductive substrate 1b is provided with a printed substrate for control wiring (13, 14a to 14c) arranged on the top surface side. The printed substrate (13, 14a to 14c) includes an insulating layer 13, and conductive layers 14a to 14c arranged separately from each other on the top surface side of the insulating layer 13. The insulating layer 13 can be made from the same material as the insulating layer 11, and the respective conductive layers 14a to 14c can be made from the same material as the conductive layers 12a to 12e.

The insulating layer 13 and the conductive layer 14a are arranged to extend from the end part of the conductive substrate 1b along the region between the semiconductor chips 3g to 3i and the semiconductor chips 3j to 3l. The control terminal 4e is bonded to the conductive layer 14a by use of bonding material such as solder or sintered material. The conductive layer 14a is electrically connected to the respective gate electrodes of the semiconductor chips 3g to 3l via control wires (bonding wires) 72g to 72l. The control terminal 4e applies a control signal to the respective gate electrodes of the semiconductor chips 3g to 3l through the conductive layer 14a and the bonding wires 72g to 72l.

The conductive layer 14b is arranged parallel to the conductive layer 14a so as to extend from the end part of the conductive substrate 1b along the region between the semiconductor chips 3g to 3i and the semiconductor chips 3j to 3l. The control terminal 4f is bonded to the conductive layer 14b by use of bonding material such as solder or sintered material. The conductive layer 14b is electrically connected to part of the respective source electrodes 31g to 31l of the semiconductor chips 3g to 3l via control wires (bonding wires) 71g to 71l. The control terminal 4f detects a current flowing through the respective source electrodes 31g to 31l of the semiconductor chips 3g to 3l via the bonding wires 71g to 71l and the conductive layer 14b.

The control terminal 4g is bonded to the conductive layer 14c by use of bonding material such as solder or sintered material. The conductive layer 14c is connected to the conductive substrate 1b via a control wire (a bonding wire) 74. The control terminal 4g detects a current flowing through the respective drain electrodes of the semiconductor chips 3g to 3l via the bonding wire 74 and the conductive layer 14c.

FIG. 9 is a perspective view illustrating the conductive member 6 implementing one of the constitutional elements of the integrated structure body (2a, 6, 8). As illustrated in FIG. 9, the conductive member 6 incudes pad bonding parts 61a to 61c, a connection part 62 connected to the pad bonding parts 61a to 61c, chip bonding parts 63a to 63c connected to the connection part 62, connection parts 64a to 64c connected to the chip bonding parts 63a to 63c, and chip bonding parts 63d to 6f connected to the connection parts 64a to 64c. The respective pad bonding parts 61a to 61c and the respective chip bonding parts 63a to 63f are bent to project downward and connected to the connection part 62 and the respective connection parts 64a to 64c. The respective connection parts 64a to 64c have a stripe-shaped planar pattern extending parallel to and separately from each other.

At least the respective bottom surfaces of the pad bonding parts 61a to 61c are exposed on the resin member 8 illustrated in FIG. 3 to FIG. 6. The pad bonding parts 61a to 61c are bonded to the pads 15a to 15c on the top surface side of the conductive substrate 1a illustrated in FIG. 7 and FIG. 8 by use of bonding material such as solder or sintered material. The connection part 62 and the respective connection parts 64a to 64c are covered with the resin member 8 illustrated in FIG. 3 to FIG. 6. At least the respective bottom surfaces of the chip bonding parts 63a to 63f are exposed on the resin member 8 illustrated in FIG. 3 to FIG. 6. The chip bonding parts 63a to 63f are bonded to the source electrodes 31g to 31l of the semiconductor chips 3g to 3l illustrated in FIG. 7 and FIG. 8 by use of bonding material such as solder or sintered material.

Figure 10:
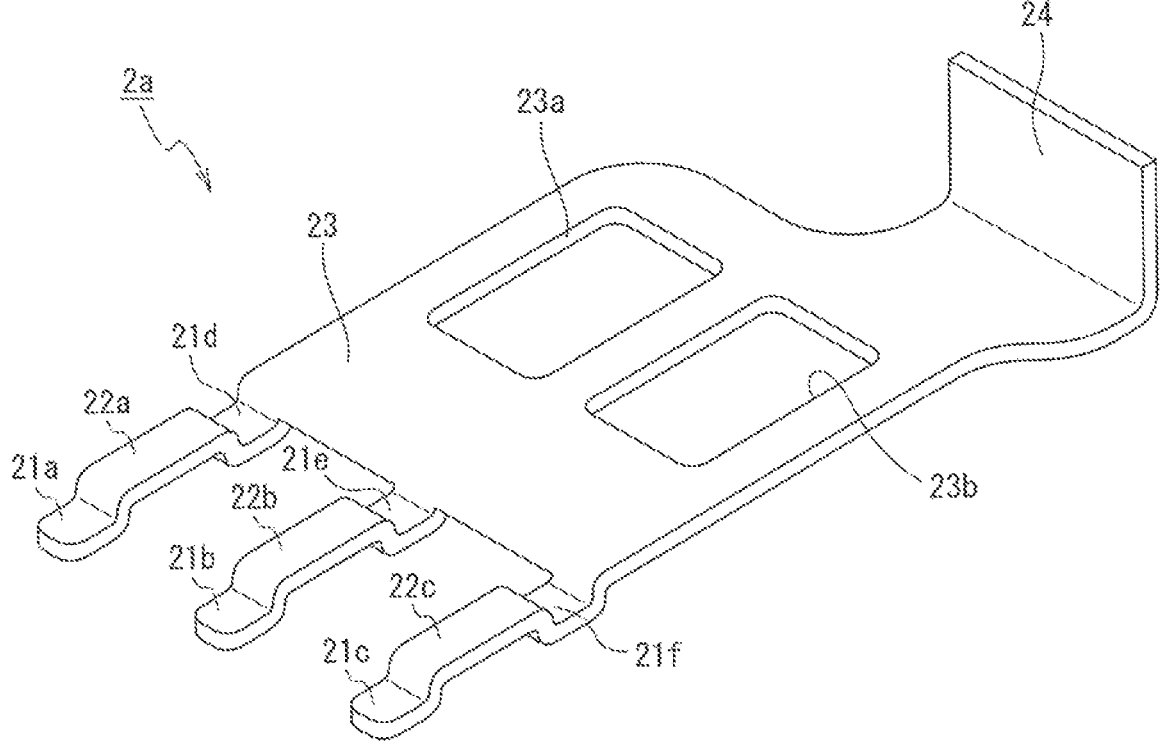
FIG. 10 is a perspective view illustrating a negative electrode terminal of the semiconductor device according to the first embodiment.

FIG. 10 is a perspective view illustrating the negative electrode terminal 2a implementing one of the constitutional elements of the integrated structure body (2a, 6, 8). As illustrated in FIG. 10, the negative electrode terminal 2a includes chip bonding parts 21a to 21c, connection parts 22a to 22c connected to the chip bonding parts 21a to 21c, chip bonding parts 21d to 21f connected to the connection parts 22a to 22c, a connection part 23 connected to the chip bonding parts 21d to 21f, and an external connection part 24 connected to the connection part 23. The chip bonding parts 21a to 21f, the connection parts 22a to 22c, and the external connection part 24 are exposed on the resin member 8 illustrated in FIG. 3 to FIG. 6. A part of the connection part 23 is exposed on the resin member 8 illustrated in FIG. 3 to FIG. 6, while the other part of the connection part 23 is covered with the resin member 8.

The respective chip bonding parts 21a to 21f illustrated in FIG. 10 are bent to project downward and connected to the connection parts 22a to 22c. The chip bonding parts 21a to 21f are bonded to the source electrodes 31a to 31f of the semiconductor chips 3a to 3f illustrated in FIG. 7 and FIG. 8 by use of bonding material such as solder or sintered material. The respective connection parts 22a to 22c have a stripe-shaped planar pattern extending parallel to and separately from each other.

The connection part 23 has a substantially rectangular planar pattern. The connection part 23 is arranged to be opposed to the pad bonding parts 61a to 61c, the connection part 62, the chip bonding parts 63a to 63f, and the connection parts 64a to 64c of the conductive member 6 illustrated in FIG. 9. The connection part 23 is provided with openings 23a and 23b penetrating from the top surface to the bottom surface of the connection part 23. The openings 23a and 23b each have a substantially rectangular planar pattern. The opening 23a is located to overlap with the space between the respective connection parts 64a and 64b illustrated in FIG. 9. The opening 23b is located to overlap with the space between the respective connection parts 64b and 64c illustrated in FIG. 9.

The opening 23a is located to overlap with a control wiring region in a plan view including the bonding wires 71h, 71k, 72h, and 72k connected to the semiconductor chips 3h and 3k illustrated in FIG. 7 and FIG. 8. The opening 23b is located to overlap with a control wiring region including the bonding wires 71*i*, 71*l*, 72*i*, and 72*l* connected to the semiconductor chips 3*i* and 3*l* illustrated in FIG. 7 and FIG. 8.

The part of the negative electrode terminal 2*a* corresponding to the external connection part 24 may be defined as a "negative electrode terminal", and the other part including the chip bonding parts 21*a* to 21*c*, the connection parts 22*a* to 22*c*, the chip bonding pats 21*d* to 21*f*, and the connection part 23 other than the externa connection part 24 may be defined as a "lead frame" integrated with the "negative electrode terminal".

Figure 11:
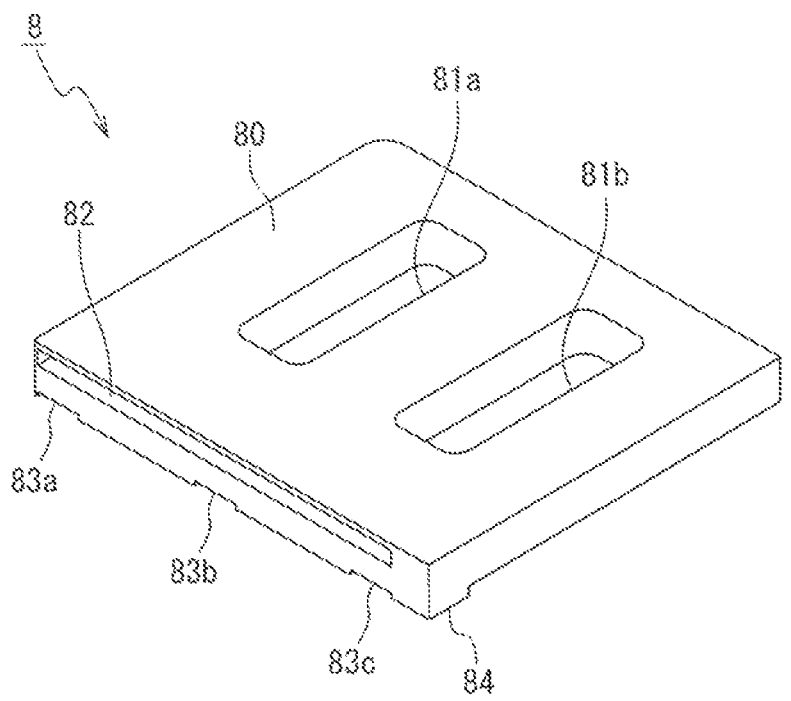
FIG. 11 is a perspective view illustrating a resin member of the semiconductor device according to the first embodiment.

FIG. 11 is a perspective view illustrating the resin member 8 implementing one of the constitutional elements of the integrated structure body (2*a*, 6, 8). As illustrated in FIG. 11, the resin member 8 includes a body part 80 having a substantially rectangular cuboidal outline. The body part 80 is provided on one of the side surfaces with an opening 82 and openings 83*a* to 83*c*. The connection part 23 of the negative electrode terminal 2*a* is partly exposed to the opening 82. The pad bonding parts 61*a* to 61*c* of the conductive member 6 are exposed to the openings 83*a* to 83*c* respectively. The body part 80 is provided with openings 81*a* and 81*b* penetrating from the top surface to the bottom surface of the body part 80. The openings 81*a* and 81*b* are located to respectively overlap with the openings 23*a* and 23*b* of the negative electrode terminal 2*a* illustrated in FIG. 10.

As illustrated in FIG. 3 and FIG. 4, the opening 81*a* of the resin member 8 is located to overlap with the control wiring region including the bonding wires 71*h*, 71*k*, 72*h*, and 72*k* connected to the semiconductor chips 3*h* and 3*k* in the plan view when the integrated structure body (2*a*, 6, 8) is arranged on the top surface side of the respective conductive substrates 1*a* and 1*b*. The opening 81*b* is located to overlap with the control wiring region including the bonding wires 71*i*, 71*l*, 72*i*, and 72*l* connected to the semiconductor chips 3*i* and 3*l*.

As illustrated in FIG. 4 to FIG. 6, a support part 84 and support parts 85*a* to 85*e* are provided on the bottom surface side of the body part 80. FIG. 4 schematically indicates the support parts 85*a* to 85*e* hidden under the body part 80 by the broken lines. The support part 84 and the support parts 85*a* to 85*e* are formed integrally with the body part 80. The support part 84 is arranged on the top surface side of the conductive substrate 1*a*. The support parts 85*a* to 85*e* are arranged on the top surface side of the conductive substrate 1*b*. The respective support parts 85*a* to 85*e* are illustrated with a case of having a pillar-like shape, for example, but are not limited to this case. The arranged positions and the number of the support parts 85*a* to 85*e* may be changed as appropriate.

The provision of the support part 84 and the support parts 85*a* to 85*e* on the bottom surface side of the body part 80 can suppress an inclination of the integrated structure body (2*a*, 6, 8) including the chip bonding parts 21*a* to 21*f* of the negative electrode terminal 2*a* and the chip bonding parts 63*a* to 63*f* of the conductive member 6 so as to avoid an increase in height of the integrated structure body (2*a*, 6, 8) when the chip bonding parts 21*a* to 21*f* and the chip bonding parts 63*a* to 63*f* are bonded by soldering to the respective source electrodes of the semiconductor chips 3*a* to 3*l*.

The surface of the resin member 8 may be subjected to embossing treatment or the like so as to be roughened. The roughened surface of the resin member 8 can avoid a separation and thus improve the adhesion between the resin member 8 and the sealing resin 10. The roughening treatment may be executed on either the entire surface or a part of the surface of the resin member 8.

Figure 12:
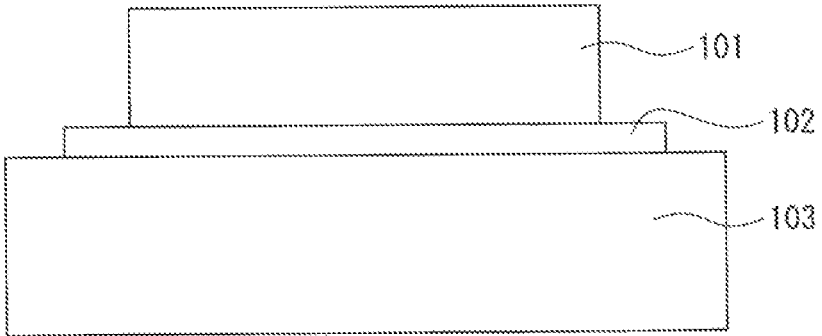
FIG. 12 is a side view illustrating a packaged structure of the semiconductor device according to the first embodiment.

FIG. 12 is a schematic side view illustrating a packaged structure of a semiconductor device 101 according to the first embodiment. The semiconductor device 101 corresponds to the semiconductor device illustrated in FIG. 1 and FIG. 2, and the respective bottom surfaces of the conductive substrates 1*a* and 1*b* are exposed on the bottom surface of the semiconductor device 101. A cooling device (a base) 103 is arranged on the bottom surface side of the semiconductor device 101 with a sheet-like resin layer (a resin sheet) 102 interposed.

The resin sheet 102 is a member for ensuring both the insulation and the adhesion between the semiconductor device 101 and the cooling device 103 while enabling the release of heat from the semiconductor device 101 toward the cooling device 103. The material used for the resin sheet 102 can be epoxy resin, for example. The material used for the cooling device 103 can be copper (Cu), aluminum (Al), composite material (AlSiC) including Al and silicon carbide, or composite material (MgSiC) including magnesium (Mg) and silicon carbide, for example.

The packaged structure of the semiconductor device 101 can integrate the functions of the insulation, the adhesion, and the heat release into the resin sheet 102, so as to reduce the costs accordingly, as compared with a case in which the insulated circuit substrate is bonded to the cooling device by soldering.

Figure 13:
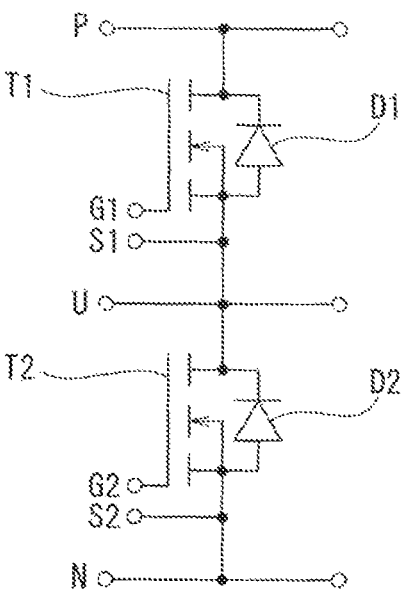
FIG. 13 is an equivalent circuit diagram of the semiconductor device according to the first embodiment.

FIG. 13 is an equivalent circuit diagram illustrating the semiconductor device according to the first embodiment. As illustrated in FIG. 13, the semiconductor device according to the first embodiment implements a part of a three-phase bridge circuit. A drain electrode of a transistor T1 on the upper arm side is connected to a positive electrode terminal P, and a source electrode of a transistor T2 on the lower arm side is connected to a negative electrode terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to gate electrodes of the transistors T1 and T2. Body diodes D1 and D2 each serving as a freewheeling diode (FWD) are internally connected in antiparallel to the transistors T1 and T2.

The output terminal U, the positive electrode terminal P, and the negative electrode terminal N illustrated in FIG. 13 respectively correspond to the output terminal 2*c*, the positive electrode terminal 2*b*, and the negative electrode terminal 2*a* illustrated in FIG. 7 and FIG. 8. The transistor T1 and the body diode D1 illustrated in FIG. 13 correspond to the semiconductor chips 3*g* to 3*l* illustrated in FIG. 7 and FIG. 8. The transistor T2 and the body diode D2 illustrated in FIG. 13 correspond to the semiconductor chips 3*a* to 3*f* illustrated in FIG. 7 and FIG. 8. The gate control terminals G1 and G2 illustrated in FIG. 13 correspond to the control terminals 4*a* and 4*e* illustrated in FIG. 7 and FIG. 8. The auxiliary source terminals S1 and S2 illustrated in FIG. 13 correspond to the control terminals 4*b* and 4*f* illustrated in FIG. 7 and FIG. 8.

An example of a method of manufacturing the semiconductor device according to the first embodiment is described below. As illustrated in FIG. 7 and FIG. 8, the output terminal 2*c*, the semiconductor chips 3*a* to 3*f*, the printed substrate (11, 12*a* to 12*e*), and the pads 15*a* to 15*c* are bonded to the top surface of the conductive substrate 1*a* by use of bonding material such as solder or sintered material. The control terminals 4*a* to 4*d* and the temperature detection chip 5 are further bonded to the top surface of the printed substrate (11, 12a to 12e) by use of bonding material such as solder or sintered material. The semiconductor chips 3a to 3f, the printed substrate (11, 12a to 12e), and the temperature detection chip 5 are then connected to each other via the bonding wires 71a to 71f, 72a to 72f, and 73.

As illustrated in FIG. 7 and FIG. 8, the positive electrode terminal 2b, the semiconductor chips 3g to 3l, and the printed substrate (13, 14a to 14c) are bonded to the top surface of the conductive substrate 1b by use of bonding material such as solder or sintered material. The control terminals 4e to 4g are further bonded to the top surface of the printed substrate (13, 14a to 14c) by use of bonding material such as solder or sintered material. The semiconductor chips 3g to 3l and the printed substrate (13, 14a to 14c) are then connected to each other via the bonding wires 71g to 71l and 72g to 72l.

The conductive member 6 illustrated in FIG. 9, the negative electrode terminal 2a illustrated in FIG. 10, and the resin member 8 illustrated in FIG. 11 are integrally formed by integral molding with a metal mold so as to prepare the integrated structure body (2a, 6, 8).

Next, as illustrated in FIG. 3 to FIG. 6, the conductive substrate 1a to which the semiconductor chips 3a to 3f and the like are bonded and the conductive substrate 1b to which the semiconductor chips 3g to 3l and the like are bonded are led to be opposed to the integrated structure body (2a, 6, 8). The chip bonding parts 21a to 21f of the negative electrode terminal 2a implementing a part of the integrated structure body (2a, 6, 8) are then bonded to the source electrodes 31a to 31f of the semiconductor chips 3a to 3f by use of bonding material such as solder or sintered material. Similarly, the chip bonding parts 63a to 63f of the conductive member 6 implementing a part of the integrated structure body (2a, 6, 8) are bonded to the source electrodes 31g to 31l of the semiconductor chips 3g to 3l by use of bonding material such as solder or sintered material. Similarly, the pad bonding parts 61a to 61c of the conductive member 6 are bonded to the pads 15a to 15c on the top surface side of the conductive substrate 1a by use of bonding material such as solder or sintered material.

Next, the semiconductor chips 3a to 3l and the like are sealed with the sealing resin 10 by transfer molding, as illustrated in FIG. 1. The semiconductor device according to the first embodiment is thus completed.

The semiconductor device according to the first embodiment described above has the integrated structure body (2a, 6, 8) including the negative electrode terminal 2a, the conductive member 6, and the resin member 8 integrated together so as to implement a three-dimensionally-wired main wiring substrate, while including the control wiring circuit implemented by the printed substrate for control wiring (11, 12a to 12e) and the printed substrate for control wiring (13, 14a to 14c) so as to include the separated substrates.

The semiconductor device according to the first embodiment having the configuration as described above thus can decrease the wiring area, so as to achieve a reduction in chip size and cost and also ensure the low inductance properties, as compared with the conventional semiconductor device in which the semiconductor chips are mounted on the circuit pattern of the insulated circuit substrate so that the semiconductor chips and the circuit pattern of the insulated circuit substrate are electrically connected together via lead frames and bonding wires.

Further, the semiconductor device according to the first embodiment having the configuration as described above can ensue the reliability of the connection parts, so as to facilitate an inspection process to achieve a reduction in cost accordingly, as compared with the conventional semiconductor device in which the printed substrate is arranged over the semiconductor chips mounted on the insulated circuit substrate so that the semiconductor chips and the printed substrate are electrically connected together by use of pin terminals. Further, the semiconductor device according to the first embodiment does not need to consider a problem of a cause of any curve or thermal deformation in the printed substrate, so as to increase the packaging performance and increase the reliability to facilitate the handling accordingly.

Further, the semiconductor device according to the first embodiment having the configuration as described above does not need to use a casing, so as to achieve a reduction in space, a decrease in the number of manufacturing steps, and a reduction in cost, as compared with the conventional semiconductor device that uses a casing for surrounding the insulated circuit substrate so as to inject resin by potting to seal the insulated circuit substrate.

As described above, the semiconductor device according to the first embodiment can exhibit the wiring technique that contributes to a reduction in cost and facilitates the manufacturing process without requiring a complicated member-positioning accurate control technique, and can further keep the heat-releasing performance and achieve the low inductance performance that can maximize the characteristics of the semiconductor chips including silicon carbide (SIC) and the like. The semiconductor device according to the first embodiment having the configuration as described above is particularly effective for a case in which a plurality of small semiconductor chips including SiC are connected in parallel in order to reduce the manufacturing costs, since this configuration can greatly contribute to a decrease in wiring area if including the plural semiconductor chips.

Second Embodiment

Figure 15:
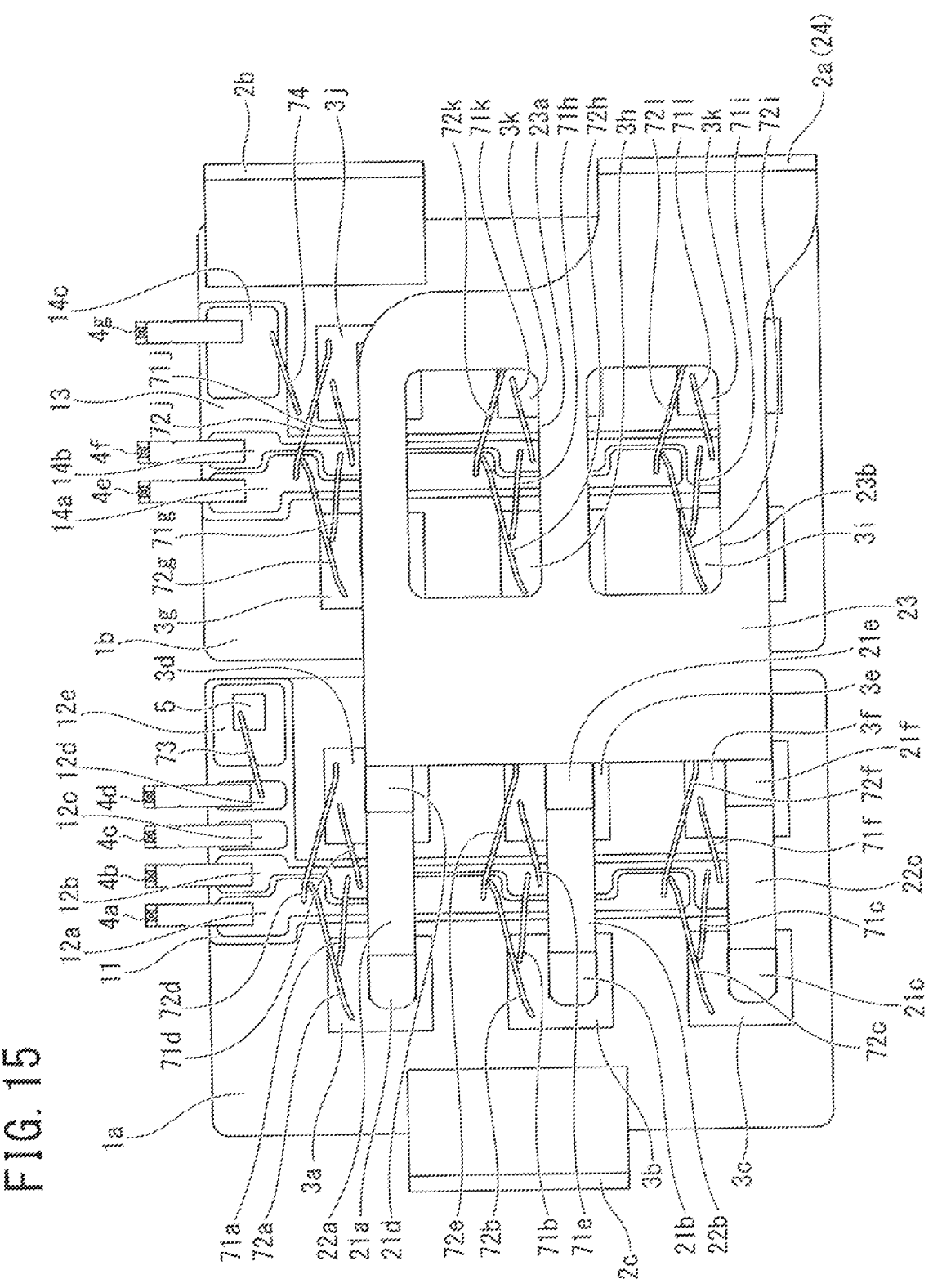
FIG. 15 is a plan view corresponding to FIG. 14.

A semiconductor device according to a second embodiment has an external appearance similar to that of the semiconductor device according to the first embodiment illustrated in FIG. 1 and FIG. 2. FIG. 14 is a perspective view illustrating the semiconductor device according to the second embodiment while omitting the sealing resin 10 illustrated in FIG. 1 and FIG. 2, and FIG. 15 is a plan view corresponding to FIG. 14. The semiconductor device according to the second embodiment includes a printed substrate similar to that in the semiconductor device according to the first embodiment.

As illustrated in FIG. 14 and FIG. 15, the semiconductor device according to the second embodiment differs from the semiconductor device according to the first embodiment in including a resin member 9 arranged to be interposed between the negative electrode terminal 2a and the conductive member 6. The semiconductor device according to the second embodiment has a laminated structure body (2a, 6, 9) including the negative electrode terminal 2a, the conductive member 6, and the resin member 9 stacked together. The negative electrode terminal 2a and the conductive member 6 implementing the constitutional elements of the laminated structure body (2a, 6, 9) have the same structure as the negative electrode terminal 2a illustrated in FIG. 10 and the conductive member 6 illustrated in FIG. 9 respectively.

Figure 16:
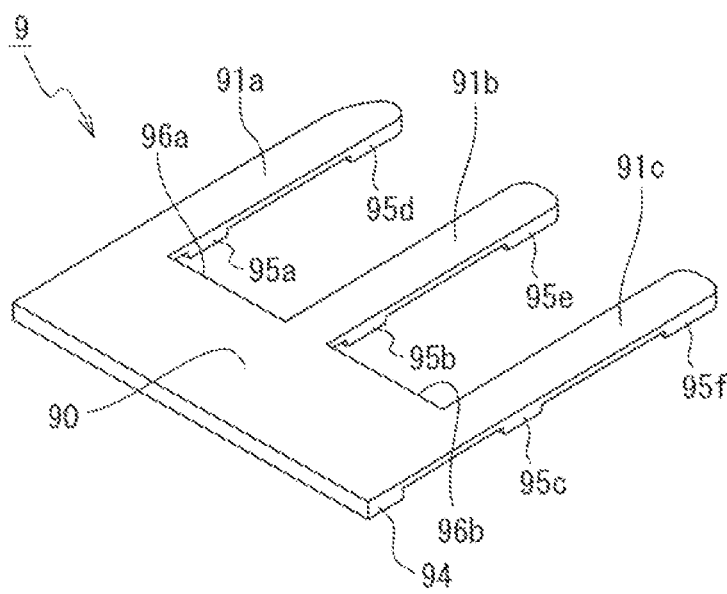
FIG. 16 is a perspective view illustrating a resin member of the semiconductor device according to the second embodiment.

FIG. 16 is a perspective view illustrating the resin member 9 as one of the constituent elements of the laminated structure body (2a, 6, 9). As illustrated in FIG. 16, the resin member 9) includes a flat part 90 and stripe parts 91a to 91e connected to the flat part 90. The flat part 90 is arranged between the connection part 62 of the conductive member 6 illustrated in FIG. 9 and the connection part 23 of the negative electrode terminal 2*a* illustrated in FIG. 10. The flat part 90 is provided with a projecting part 94 on the bottom surface side. The projecting part 94 is fitted to the pad bonding parts 61*a* to 61*c* of the conductive member 6 curved downward illustrated in FIG. 9. The flat part 90 is not necessarily provided with the projecting part 94.

The stripe part 91*a* is interposed between the chip bonding part 63*a*, the connection part 64*a*, and the chip bonding part 63*d* of the conductive member 6 illustrated in FIG. 9 and the stripe part at the end of the negative electrode terminal 2*a* on the outer side of the opening 23*a* of the connection part 23 illustrated in FIG. 10. The stripe part 91*a* is provided with projecting parts 95*a* and 95*d* on the bottom surface side. The projecting parts 95*a* and 95*d* are respectively fitted to the chip bonding parts 63*a* and 63*d* of the conductive member 6 curved downward illustrated in FIG. 9.

The stripe part 91*b* is interposed between the chip bonding part 63*b*, the connection part 64*b*, and the chip bonding part 63*e* of the conductive member 6 illustrated in FIG. 9 and the stripe part located between the respective openings 23*a* and 23*b* of the connection part 23 of the negative electrode terminal 2*a* illustrated in FIG. 10. The stripe part 91*b* is provided with projecting parts 95*b* and 95*e* on the bottom surface side. The projecting parts 95*b* and 95*e* are respectively fitted to the chip bonding parts 63*b* and 63*e* of the conductive member 6 curved downward illustrated in FIG. 9.

The stripe part 91*c* is interposed between the chip bonding part 63*c*, the connection part 64*c*, and the chip bonding part 63*f* of the conductive member 6 illustrated in FIG. 9 and the stripe part at the end of the negative electrode terminal 2*a* on the outer side of the opening 23*b* of the connection part 23 illustrated in FIG. 10. The stripe part 91*c* is provided with projecting parts 95*c* and 95*df* on the bottom surface side. The projecting parts 95*c* and 95*f* are respectively fitted to the chip bonding parts 63*c* and 63*f* of the conductive member 6 curved downward illustrated in FIG. 9.

The space between the respective stripe parts 91*a* and 91*b* is defined to overlap with the space between the respective connection parts 64*a* and 64*b* of the conductive member 6 illustrated in FIG. 9 and overlap with the opening 23*a* of the connection part 23 of the negative electrode terminal 2*a* illustrated in FIG. 10. The space between the respective stripe parts 91*b* and 91*c* is defined to overlap with the space between the respective connection parts 64*b* and 64*c* of the conductive member 6 illustrated in FIG. 9 and overlap with the opening 23*b* of the connection part 23 of the negative electrode terminal 2*a* illustrated in FIG. 10.

Figure 17:
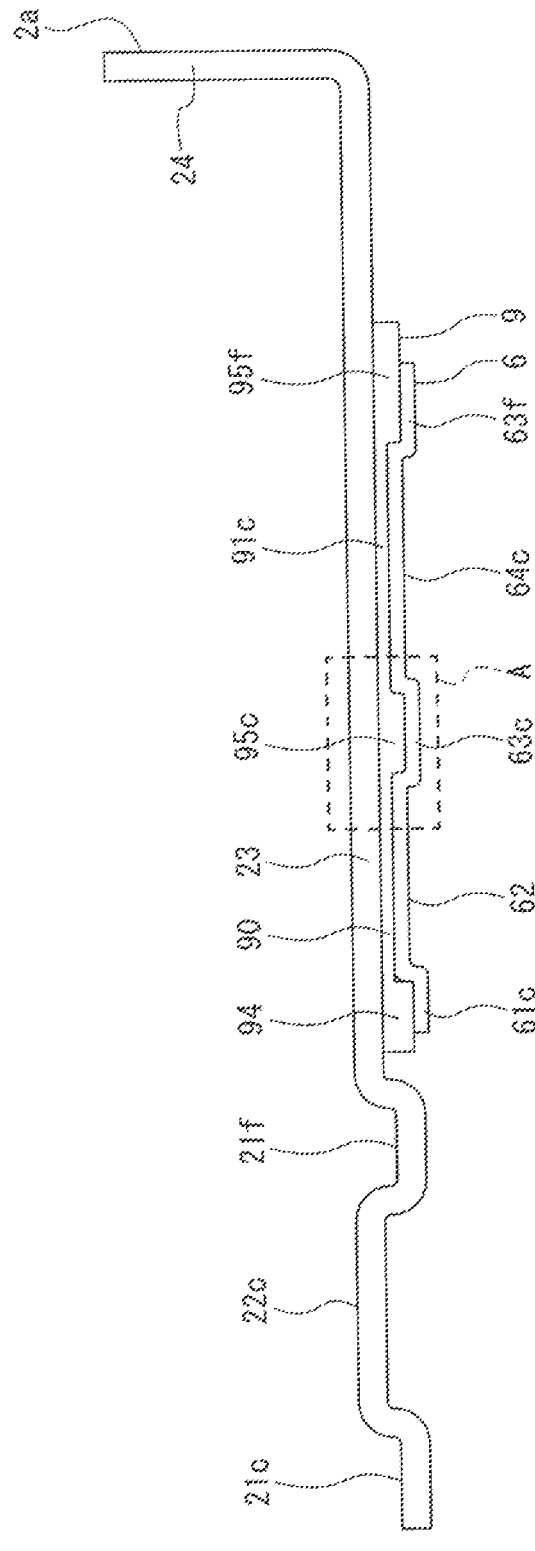
FIG. 17 is a side view illustrating a laminated structure of the semiconductor device according to the second embodiment.

FIG. 17 is a side view illustrating the laminated structure body (2*a*, 6, 9). As illustrated in FIG. 17, the chip bonding parts 63*c* and 63*f* of the conductive member 6 on the top surface side are in contact with the projecting parts 95*c* and 95*f* of the resin member 9 respectively. Similarly, the chip bonding parts 63*a*, 63*b*, 63*d*, and 63*e* of the conductive member 6 on the top surface side are in contact with the projecting parts 95*a*, 95*b*, 95*d*, and 95*e* of the resin member 9 respectively. As illustrated in FIG. 17, the flat part 90 and the stripe part 91*c* of the resin member 9 on the top surface side are in contact with the bottom surface of the contact part 23 of the negative electrode terminal 2*a*. Similarly, the respective stripe parts 91*a* and 91*b* of the resin member 9 on the top surface side are in contact with the bottom surface of the connection part 23 of the negative electrode terminal 2*a*.

Figure 18:
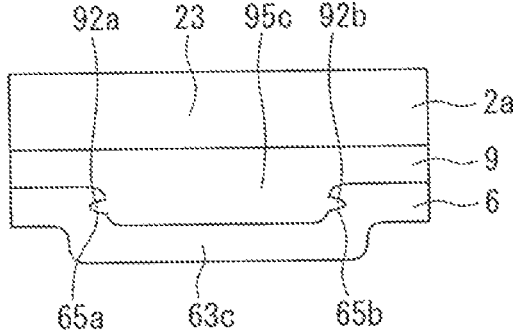
FIG. 18 is an enlarged side view illustrating region A in FIG. 17.

FIG. 18 is an enlarged side view of region A surrounded by the broken line illustrating the circumference of the projecting part 95*c* of the resin member 9 in FIG. 17. The side surface of the projecting part 95*c* of the resin member 9 is provided with engagement parts (protruding parts) 92*a* and 92*b*. The curved part of the projecting part 63*c* of the conductive member 6 is provided with engagement parts (recessed parts) 65*a* and 65*b*. The protruding parts 92*a* and 92*b* of the resin member 9 and the recessed parts 65*a* and 65*b* of the conductive member 6 are engaged (fitted) together, so that the conductive member 6 and the resin member 9 are fixed to each other.

Figure 19:
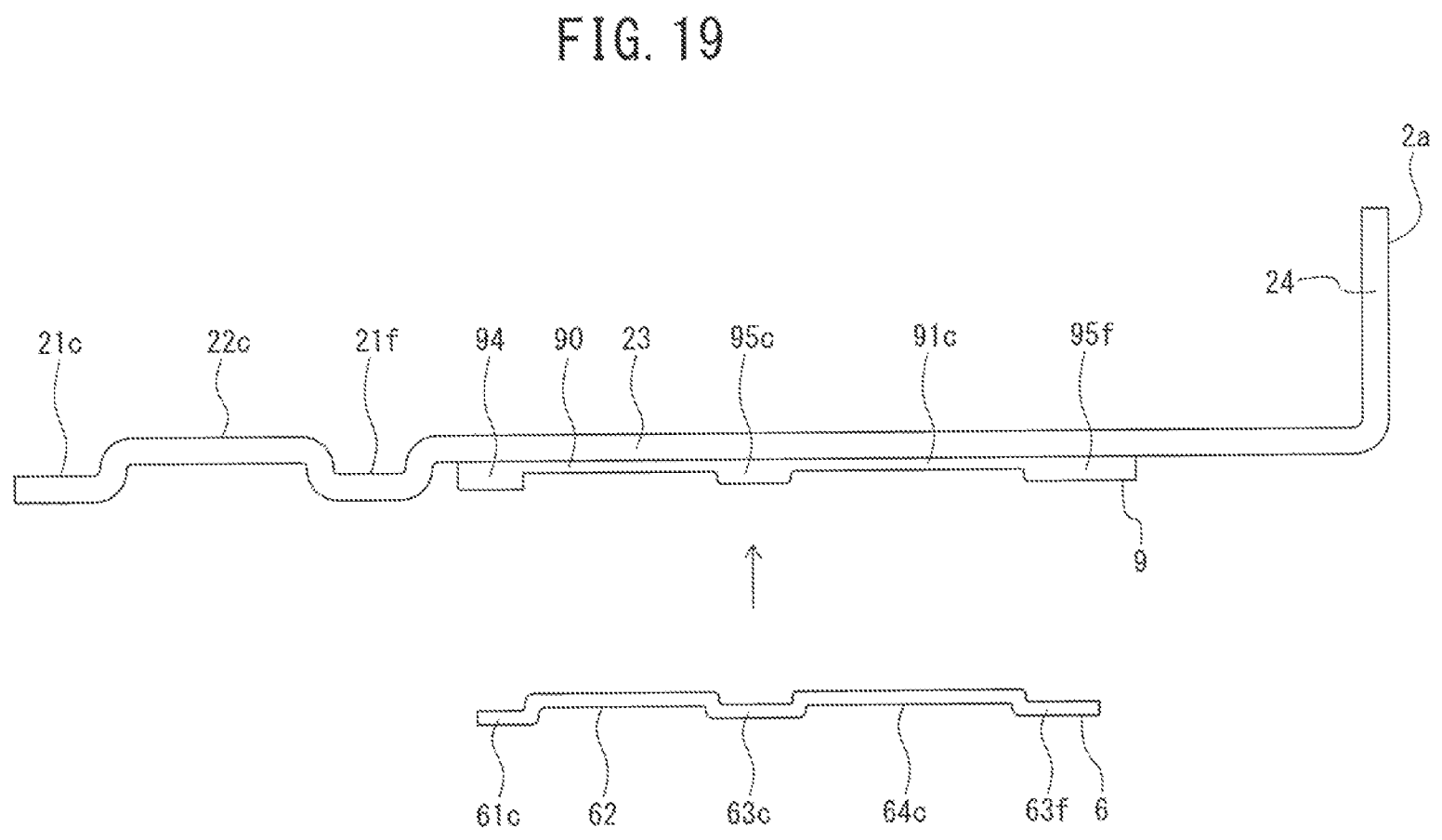

FIG. 19 is a view illustrating an example of a method of assembling the laminated structure body (2*a*, 6, 9) illustrated in FIG. 17. First, the negative electrode terminal 2*a*, the resin member 9, and the conductive member 6 are prepared, and the top surface of the resin member 9 is bonded (fixed) to the bottom surface of the negative electrode terminal 2*a* by pressure bonding, for example, as illustrated in FIG. 19. Next, the top surface of the conductive member 6 is opposed to the bottom surface of the resin member 9 fixed to the negative electrode terminal 2*a* so as to be fixed together by pressure bonding or the like. At this point, the protruding parts 92*a* and 92*b* of the resin member 9 and the recessed parts 65*a* and 65*b* of the conductive member 6 are engaged (fitted) together, so that the top surface of the conductive member 6 is stably fixed to the bottom surface of the resin member 9.

The other configurations of the semiconductor device according to the second embodiment are substantially the same as those of the semiconductor device according to the first embodiment, and overlapping explanations are not repeated below.

The semiconductor device according to the second embodiment has the laminated structure body (2*a*, 6, 9) including the negative electrode terminal 2*a*, the conductive member 6, and the resin member 9 integrated together so as to implement the three-dimensionally-wired main wiring substrate, while including the control wiring circuit implemented by the printed substrate for control wiring (11, 12*a* to 12*e*) and the printed substrate for control wiring (13, 14*a* to 14*c*) so as to include the separated substrates. This configuration can decrease the wiring area, so as to avoid an increase in chip size and cost, ensuring the low inductance properties accordingly.

Figure 20:
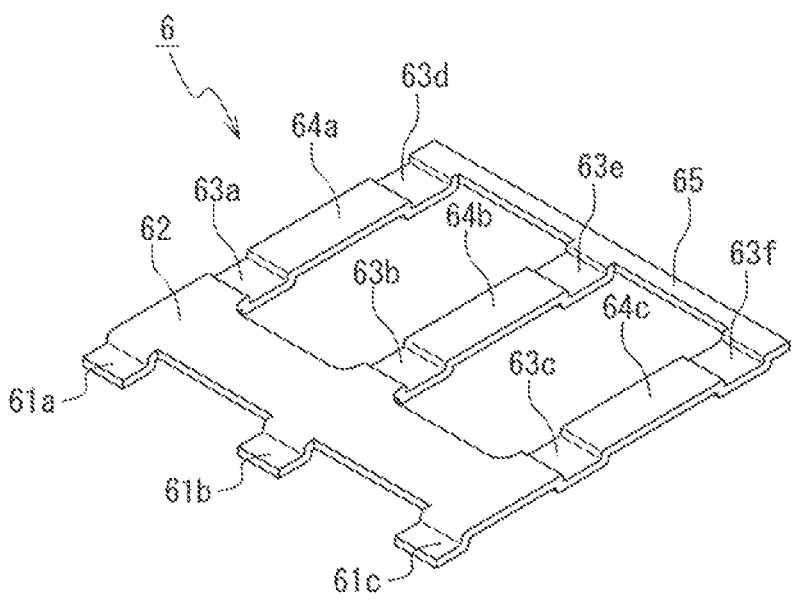
FIG. 20 is a perspective view illustrating a conductive member of a semiconductor device according to a modified example of the second embodiment.
Figure 21:
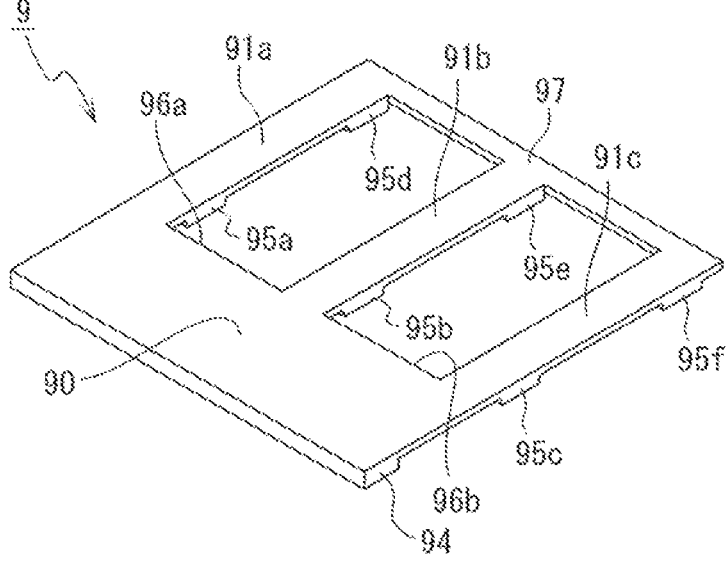
FIG. 21 is a perspective view illustrating a resin member of the semiconductor device according to the modified example of the second embodiment.

FIG. 20 is a perspective view illustrating another example of the conductive member 6 implementing one of the constituent elements of the laminated structure body (2*a*, 6, 9). The conductive member 6 illustrated in FIG. 20 differs from the conductive member 6 illustrated in FIG. 9 in further having a connection part 65 connected to the chip bonding parts 63*d* to 63*f*. FIG. 21 is a perspective view illustrating another example of the resin member 9 implementing one of the constituent elements of the laminated structure body (2*a*, 6, 9). The resin member 9 illustrated in FIG. 21 differs from the resin member 9 illustrated in FIG. 16 in further having a connection part 97 connected to the stripe parts 91*a* to 91*c*. The semiconductor device according to the second embodiment may include the laminated structure body (2*a*, 6, 9) implemented by the conductive member 6 illustrated in FIG. 20, the resin member 9 illustrated in FIG. 21, and the negative electrode terminal 2*a* illustrated in FIG. 10.

Other Embodiments

While the present invention has been described above by reference to the first and second embodiments, it should be understood that the present invention is not intended to be limited to the descriptions and the drawings composing part of this disclosure. Various alternative embodiments, examples, and technical applications will be apparent to those skilled in the art according to this disclosure.

For example, the first and second embodiments have been illustrated with the case of including the conductive substrate 1a and the conductive substrate 1b, but the present invention may also be applied to a case of using a circuit pattern on the upper surface side of an insulated circuit substrate such as a direct copper bonded (DCB) substrate for the conductive substrate 1a and the conductive substrate 1b.

Further, the configurations disclosed in the first and second embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

The invention claimed is:

1. A semiconductor device comprising:
a conductive substrate;
a plurality of semiconductor chips each having a first main electrode on a bottom surface side and a second main electrode on a top surface side, the plural semiconductor chips being arranged to form a first column and a second column connected parallel to each other on the conductive substrate; and
a control wiring substrate including an insulating layer, a plurality of top-surface conductive layers provided on a top surface of the insulating layer, and a plurality of bottom-surface conductive layers each having a narrower width than the insulating layer and provided on a bottom surface of the insulating layer, the bottom-surface conductive layers being arranged on the conductive substrate between the first column and the second column of the semiconductor chips.

2. The semiconductor device of claim 1, further comprising a temperature detection chip on the control wiring substrate.

3. The semiconductor device of claim 1, wherein the plural top-surface conductive layers extend parallel to each other and have wide regions alternately arranged.

4. The semiconductor device of claim 1, wherein the plural top-surface conductive layers each have a terminal.

* * * * *